(12) United States Patent
Forbes

(10) Patent No.: US 7,177,193 B2
(45) Date of Patent: *Feb. 13, 2007

(54) PROGRAMMABLE FUSE AND ANTIFUSE AND METHOD THEREFOR

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/214,528

(22) Filed: Aug. 29, 2005

(65) Prior Publication Data

US 2006/0002187 A1 Jan. 5, 2006

Related U.S. Application Data

(60) Continuation of application No. 10/719,217, filed on Nov. 20, 2003, now Pat. No. 6,956,772, which is a division of application No. 09/782,543, filed on Feb. 13, 2001, now Pat. No. 6,674,667.

(51) Int. Cl.
*G11C 16/06* (2006.01)

(52) U.S. Cl. ............... 365/185.18; 365/185.24; 365/185.27

(58) Field of Classification Search ........ 365/185.18, 365/185.27, 185.24, 225.7
See application file for complete search history.

(56) References Cited

U.S. PATENT DOCUMENTS

| | | | |
|---|---|---|---|
| 3,992,701 A | 11/1976 | Abbas et al. | |
| 4,051,354 A | 9/1977 | Choate | |
| 4,335,391 A | 6/1982 | Morris | |
| 4,761,768 A | 8/1988 | Turner et al. | |
| 4,766,569 A | 8/1988 | Turner et al. | |
| 4,870,470 A | 9/1989 | Bass, Jr. et al. | |
| 5,172,204 A | 12/1992 | Hartstein | |

(Continued)

FOREIGN PATENT DOCUMENTS

EP 0529234 A2 3/1993

(Continued)

OTHER PUBLICATIONS

Abbas, S. A., et al., "N-Channel Igfet Design Limitations Due to Hot Electron Trapping", *Technical Digest, International Electron Devices Meeting.*, Washington, DC, (Dec. 1975),35-38.

(Continued)

*Primary Examiner*—Richard Elms
*Assistant Examiner*—Hien N Nguyen
(74) *Attorney, Agent, or Firm*—Schwegman, Lundberg, Woessner & Kluth, P.A.

(57) ABSTRACT

P-channel MOSFET devices are used as reprogrammable fuse or antifuse elements in a memory decode circuit by utilizing anomalous hole generation. An applied negative gate bias voltage is sufficiently large to cause tunnel electrons to gain enough energy to exceed the band gap energy of the oxide. This causes energetic hole-electron pairs to be generated in the silicon substrate. The holes are then injected from the substrate into the oxide, where they remain trapped. A large shift in the threshold voltage of the p-channel MOSFET results. The device can subsequently be reset by applying a positive gate bias voltage. Various circuits incorporating such fuse or antifuse elements are also disclosed.

37 Claims, 11 Drawing Sheets

U.S. PATENT DOCUMENTS

| | | |
|---|---|---|
| 5,324,681 A | 6/1994 | Lowrey et al. |
| 5,327,380 A | 7/1994 | Kersh, III et al. |
| 5,359,554 A * | 10/1994 | Odake et al. ............... 365/184 |
| 5,414,658 A | 5/1995 | Challa |
| 5,493,141 A | 2/1996 | Ricco et al. |
| 5,544,118 A | 8/1996 | Harari |
| 5,763,912 A | 6/1998 | Parat et al. |
| 5,764,096 A | 6/1998 | Lipp et al. |
| 5,768,192 A | 6/1998 | Eitan |
| 5,781,477 A | 7/1998 | Rinerson et al. |
| 5,801,401 A | 9/1998 | Forbes |
| 5,828,099 A | 10/1998 | Van Dort et al. |
| 5,851,893 A | 12/1998 | Gardner et al. |
| 5,852,306 A | 12/1998 | Forbes |
| 5,867,425 A | 2/1999 | Wong |
| 5,978,273 A | 11/1999 | Shigemura |
| 6,031,263 A | 2/2000 | Forbes et al. |
| 6,038,168 A | 3/2000 | Allen et al. |
| 6,140,181 A | 10/2000 | Forbes et al. |
| 6,141,248 A | 10/2000 | Forbes et al. |
| 6,180,957 B1 | 1/2001 | Miyasaka et al. |
| 6,229,733 B1 | 5/2001 | Male |
| 6,232,643 B1 | 5/2001 | Forbes et al. |
| 6,243,298 B1 | 6/2001 | Lee et al. |
| 6,246,606 B1 | 6/2001 | Forbes et al. |
| 6,249,020 B1 | 6/2001 | Forbes et al. |
| 6,272,042 B1 | 8/2001 | Kato et al. |
| 6,307,775 B1 | 10/2001 | Forbes et al. |
| 6,351,411 B2 | 2/2002 | Forbes et al. |
| 6,452,835 B1 | 9/2002 | Diorio et al. |
| 6,456,535 B2 | 9/2002 | Forbes et al. |
| 6,469,352 B2 | 10/2002 | Ohshima et al. |
| 6,504,762 B1 | 1/2003 | Harari |
| 6,510,086 B2 | 1/2003 | Kato et al. |
| 6,521,958 B1 | 2/2003 | Forbes et al. |
| 6,545,314 B2 | 4/2003 | Forbes et al. |
| 6,577,263 B2 | 6/2003 | Saito |
| 6,614,693 B1 | 9/2003 | Lee et al. |
| 6,664,601 B1 | 12/2003 | King |
| 6,700,821 B2 | 3/2004 | Forbes et al. |
| 6,754,108 B2 | 6/2004 | Forbes |
| 6,781,876 B2 | 8/2004 | Forbes |
| 6,804,136 B2 | 10/2004 | Forbes |
| 6,956,772 B2 * | 10/2005 | Forbes .................. 365/185.18 |
| 2001/0032997 A1 | 10/2001 | Forbes et al. |
| 2003/0234420 A1 | 12/2003 | Forbes |
| 2003/0235075 A1 | 12/2003 | Forbes |
| 2003/0235076 A1 | 12/2003 | Forbes |
| 2003/0235077 A1 | 12/2003 | Forbes |
| 2003/0235079 A1 | 12/2003 | Forbes |
| 2003/0235081 A1 | 12/2003 | Forbes |
| 2003/0235085 A1 | 12/2003 | Forbes |
| 2004/0004245 A1 | 1/2004 | Forbes et al. |
| 2004/0004247 A1 | 1/2004 | Forbes |
| 2004/0004859 A1 | 1/2004 | Forbes |
| 2004/0130951 A1 | 7/2004 | Forbes |

FOREIGN PATENT DOCUMENTS

| | | |
|---|---|---|
| JP | 6-283713 | 10/1994 |

OTHER PUBLICATIONS

Eitan, Boaz, et al., "NROM: A Novel Localized Trapping, 2-Bit Nonvolatile Memory Cell", *IEEE Electron Device Letters*, 21(11), (Nov. 2000),543-545.

Fischetti, M. V., et al., "The effect of gate metal and SiO2 thickness on the generation of donor states at the Si-SiO2 interface", *Journal of Applied Physics*, 57(2), (Jan. 1985),418-424.

Forbes, L., et al., "Field Induced Re-Emission of Electrons Trapped in SiO", *IEEE Transactions on Electron Devices*, ED-26 (11), Briefs,(Nov. 1979),1816-1818.

Hwang, N., et al., "Tunneling and Thermal Emission of Electrons from a Distribution of Deep Traps in SiO", *IEEE Transactions on Electron Devices*, 40(6), (Jun. 1993),1100-1103.

Lusky, Eli, et al., "Spatial characterization of Channel hot electron injection Utilizing subthreshold slope of NROM memory device", pp. 1-2.

Ning, T. H., "Capture cross section and trap concentration of holes in silicon dioxide", *Journal of Applied Physics*, 47(3), (Mar. 1976),1079-1081.

Ning, T. H., et al., "Completely electrically reprogrammable nonvolatile memory device using conventional p-channel MOSFET", *IBM Technical Disclosure Bulletin*, vol. 20, No. 5, (Oct. 1977),2016.

Ning, T. H., et al., "Erasable nonvolatile memory device using hole trapping in SiO2", *IBM Technical Disclosure Bulletin*, vol. 18, No. 8, (Jan. 1976),2740-2742.

Roizin, Yakov, et al., ""Dummy" GOX for Optimization of microFLASH Technology", 2 pages.

Roizin, Yakov, et al., "Activation Energy of Traps in the ONO Stack of microFLASH Memory Cells", 2 pages.

Samanta, Piyas, et al., "Coupled charge trapping dynamics in thin SiO2 gate oxide under Fowler-Nordheim stress at low electron fluence", *Journal of Applied Physics*, 83(5), (Mar. 1998),2662-2669.

European Search Report filed in corresponding EP Application No. 02724945.7 Aug. 24, 2006, 3 pgs.

US 6,859,396, 02/2005, Forbes (withdrawn)

* cited by examiner

PROGRAMMABLE FUSE AND ANTIFUSE AND METHOD THEREFOR

RELATED APPLICATIONS

This application is a Continuation under 37 C.FR. 1.53(b) of U.S. application Ser. No. 10/719,217 filed Nov. 20, 2003, now U.S. Pat. No. 6,956,772, which is a Divisional of U.S. application Ser. No. 09/782,543 filed Feb. 13, 2001, now U.S. Pat. No. 6,674,667, which applications are incorporated herein by reference.

FIELD OF THE INVENTION

The present invention relates to semiconductor integrated circuits. More particularly, the present invention relates to MOSFET technology for programmable address decode and correction.

BACKGROUND

Many electronic products use memory devices to store data. Non-volatile memory, such as electrically programmable read-only memory (EPROM) and electrically-erasable programmable read-only memory (EEPROM), are extensively used for storing data in, for example, computer systems. EPROM and EEPROM typically comprise a large number of memory cells having electrically isolated gates, referred to as floating gates. Data is stored in the memory cells in the form of charge on the floating gates. Charge is transported to or removed from the floating gates by program and erase operations, respectively.

Another type of non-volatile memory is flash memory. Flash memory is a derivative of EPROM and EEPROM. Although flash memory shares many characteristics with EPROM and EEPROM, the current generation of flash memory differs in that erase operations are performed in blocks. Flash memories have the potential of replacing hard storage disk drives in computer systems. The advantages would be replacing a complex and delicate mechanical system with a rugged and easily portable small solid-state non-volatile memory system. There is also the possibility that, given their very high potential densities, flash memories might be used to replace DRAMs if certain improvements in operating speed, e.g., in the erase operation, were realized.

A typical flash memory device comprises a memory array that includes a large number of memory cells arranged in row and column fashion. Each memory cell includes a floating gate field-effect transistor capable of holding a charge. The cells are usually grouped into blocks. Each of the cells in a block can be electrically programmed on a random basis by charging the floating gate. The charge can be removed from the floating gate by a block erase operation. The data in a cell is determined by the presence or absence of the charge in the floating gate.

Programmable address decode circuits and buffers are needed in conjunction with the memory array to allow faulty rows and/or columns of the array to be replaced by functional redundant rows and/or columns. An example of a redundancy repair scheme is shown in U.S. Pat. No. 5,324,681, issued to Lowrey on Jun. 28, 1994. Another is provided in U.S. Pat. No. 4,051,354, issued to Choate on Sep. 27, 1997. Another is provided in U.S. Pat. No. 5,327,380, issued to Kersh III on Jul. 5, 1994.

With the increasing array density of successive generations of flash memory devices, the desirability of incorporating other functions, such as programmable address decode logic, into the chip also increases. Any successful incorporated technology, however, must be cost competitive with the existing alternative of combining separate chips at the card or package level, each being produced with independently optimized technologies. Any significant addition of process steps to an existing flash memory technology in order to provide added functions, such as high speed logic, static random access memory (SRAM), or EEPROM, becomes rapidly cost prohibitive due to the added process complexity cost and decreased yield. Accordingly, there is a need to provide additional functions on a flash memory chip with little or no modification of the optimized process flow.

Programmable address decode circuits conventionally employ one time programmable (OTP) switches. Fuses and antifuses, present in peripheral circuits, are one method for constructing address decode logic. The fuse or antifuse integrally combines the functions of a switching element, which makes the interconnection, and a programming element, which stores the state of the switching element, i.e., either "off" (a blown fuse) or "on" (an unblown fuse).

Fusible elements are employed in integrated circuits to permit changes in the configuration of the integrated circuits after fabrication. For example, fusible elements can be used to replace defective circuits with redundant circuits. Memory devices are typically fabricated with redundant memory cells. The redundant memory cells may be enabled with fusible elements after fabrication to replace defective memory cells found during a test of fabricated memory devices.

One type of fusible link that can be used is a standard polysilicon fuse. The fuse comprises a polysilicon conductor approximately 0.5μ thick that is fabricated on the integrated circuit such that in its normal state there is a complete electrical path through the fuse. To program the fuse, a high power laser is used to open the electrical path by evaporating a portion of the polysilicon. The laser can be used to open selected polysilicon fuses in an integrated circuit to change its configuration. The use of polysilicon fuses, however, is attended by several disadvantages. Polysilicon fuses must be spaced apart from each other in an integrated circuit such that when one of them is being opened by a laser, the other polysilicon fuses are not damaged. A bank of polysilicon fuses therefore occupies a substantial area of an integrated circuit. As integrated circuits continue to be fabricated with high density circuitry, the need for more fusible links also increases. In addition, polysilicon fuses cannot be opened once an integrated circuit is placed in an integrated circuit package, or is encapsulated in any manner.

Another type of fusible link that has been used in integrated circuits is the antifuse. An antifuse comprises two conductive terminals separated by an insulator or a dielectric, and is fabricated as an open circuit. In this respect, the antifuse is electrically opposite of the fuse. To program the antifuse, a high voltage is applied across its terminals to rupture the insulator and form an electrical path between the terminals. One type of antifuse that is commonly used in integrated circuits is an oxide-nitride-oxide (ONO) antifuse. A typical ONO antifuse has a layer of nitride sandwiched between two layers of oxide, where the bottom layer of oxide is in contact with polysilicon and the top layer of oxide is also in contact with polysilicon. The ONO sandwich is a dielectric such that the unprogrammed antifuse functions as a capacitor. To program the ONO antifuse, a large potential is applied across the dielectric such that the dielectric is ruptured and the two polysilicon layers are shorted together.

Antifuses have several advantages that are not available with fuses. A bank of antifuses takes up much less area of an integrated circuit because they are programmed by a voltage difference that can be supplied on wires connected to the terminals of each of the antifuses. The antifuses may be placed close together in the bank, and adjacent antifuses are not at risk when one is being programmed. Antifuses can also be programmed after an integrated circuit is placed in an integrated circuit package, or encapsulated, by applying appropriate signals to pins of the package. This is a significant advantage for several reasons. First, an integrated circuit may be tested after it is in a package, and may then be repaired by replacing defective circuits with redundant circuits by programming selected antifuses. A generic integrated circuit may be tested and placed in a package before it is configured to meet the specifications of a customer. This reduces the delay between a customer order and shipment. The use of antifuses to customize generic integrated circuits also improves the production yield for integrated circuits because the same generic integrated circuit can be produced to meet the needs of a wide variety of customers.

Despite these advantages, the use of antifuses in integrated circuits is limited by a lack of adequate circuitry to support the programming and reading of the antifuses. In addition, another disadvantage with ONO antifuses is that they are fabricated with separate, extra steps when an integrated circuit is fabricated.

Conventional fuses and antifuses also share a number of significant drawbacks that limit their usefulness. One such significant drawback is that neither fuses nor antifuses are reprogrammable. Rather, they are one time programmable devices, making them difficult to test and unsuitable for a large class of applications where reprogrammability is desirable or required. Fuses and antifuses suffer from the further disadvantage of not being fabricated according to the flash memory process flow.

Micron Technology, Inc. taught in U.S. Pat. No. 5,324,681, which issued to Lowrey et al. on Jun. 28, 1994, that one time programmable (OTP) memory cells formed as MOSFETs could be used to replace laser/fuse programmable memory cells for applications such as OTP repair of DRAMs using redundant rows and columns of DRAM memory cells and OTP selection of options on a DRAM (such as fast page mode (FPM) or extended data out (EDO)). One of the key advantages of that capability is the ability to program the OTP memory cells after the DRAM memory chip is packaged, a decided advantage over previous solutions. However, the invention in the Lowrey patent still has the disadvantage of single time programmability.

Another approach to solving the programmable switching problem is described in U.S. Pat. No. 5,764,096, which issued to Lipp et al. on Jun. 9, 1998. U.S. Pat. No. 5,764,096 provides a general-purpose nonvolatile, reprogrammable switch, but does not achieve the same using the commonality in the basic DRAM cell structure. Thus, the Lipp patent does not achieve the desired result of providing nonvolatile memory functions on a DRAM chip with little or no modification of the DRAM process flow.

Still another alternative to programmable interconnects, e.g., logic switching circuits, uses a metal oxide semiconductor field effect transistor (MOSFET) as the switching element. The MOSFET is controlled by the stored memory bit of a programming element. Most commonly, this programming element is a dynamic random access memory (DRAM) cell. Such DRAM based field programmable gate arrays (FPGAs) are reprogrammable and use a DRAM process flow, but have a disadvantage in that the programming of the switching elements is lost whenever power is turned off. A separate, nonvolatile memory cell must be used to store the programmed pattern on power down, and the FPGA must be reprogrammed each time the device is powered back up. This need again increases the fabrication complexity and requires significant additional chip surface space.

Accordingly, a need continues to exist for fuse and antifuse elements that can be reprogrammed and that are compatible with MOSFET memory technology. Such elements should be capable of being fabricated on a MOSFET memory chip with little or no modification of the MOSFET memory process flow.

SUMMARY OF THE INVENTION

The above mentioned and other deficiencies are addressed in the following detailed description. According to various implementations of the present invention, p-channel MOSFET devices are used as reprogrammable fuse or antifuse elements in a memory decode circuit by utilizing anomalous hole generation. A sufficiently large negative gate bias voltage is applied to cause tunnel electrons to gain enough energy to exceed the band gap energy of the oxide. As a result, energetic hole-electron pairs are generated in the silicon substrate. The holes are then injected from the substrate into the oxide, where they remain trapped. A large shift in the threshold voltage of the p-channel MOSFET results. The device can subsequently be reset by applying a positive gate bias voltage. Accordingly, particular benefits are realized for applications in which reprogrammability is desired or required. Further, such fuse or antifuse elements can be implemented readily in the context of a MOSFET memory process flow.

According to one embodiment, the present invention is directed to a programmable switch including a metal oxide semiconductor field effect transistor (MOSFET) in a substrate. The MOSFET has first and second source/drain regions, a channel region between the first and second source/drain regions, and a gate separated from the channel region by a gate oxide. A wordline is coupled to the gate. A first transmission line is coupled to the first source/drain region. A second transmission line is coupled to the second source/drain region. The MOSFET is a programmed MOSFET having a positive charge trapped in the gate oxide such that a threshold voltage of the MOSFET is significantly altered compared to a threshold voltage of the MOSFET in an unprogrammed state. The switch may be embodied as a fuse or an antifuse.

In another embodiment, a programmable switch includes a p-channel MOSFET in a substrate. The MOSFET has a source region, a drain region, a channel region between the source region and the drain region, and a gate separated from the channel region by a gate oxide. A wordline is coupled to the gate. A sourceline is coupled to the source region. A bitline is coupled to the drain region. The MOSFET is a programmed MOSFET having a positive charge trapped in the gate oxide such that a threshold voltage of the MOSFET is significantly altered compared to a threshold voltage of the MOSFET in an unprogrammed state. The switch may be embodied as a fuse or an antifuse.

Other embodiments of the present invention include integrated circuits, programmable decoders, and electrical systems incorporating the programmable switch.

Still another embodiment is directed to a method for programming a p-channel MOSFET in a substrate into a reprogrammable switch. First and second voltage potentials are applied to source and drain regions, respectively, of the MOSFET. A negative gate potential is applied to a gate region of the MOSFET. Applying the first and second voltage potentials and the negative gate potential causes hot hole injection from the substrate into a gate oxide of the MOSFET.

In another method embodiment for programming a p-channel MOSFET in a substrate into a reprogrammable switch, both source and drain regions of the MOSFET are coupled to ground. A negative gate potential to a gate region of the MOSFET, causing hot hole injection from the substrate into a gate oxide of the MOSFET.

Yet another embodiment is directed to a method for performing address decoding in a memory, including coupling a plurality of address lines and a plurality of output lines to a programmable decoder having a plurality of rows and a plurality of redundant rows. A row is unselected by using hot hole injection to program a programmable switch associated with the row. The programmable switch includes a MOSFET in a substrate. The MOSFET has a first source/drain region, a second source/drain region, a channel region between the first and second source/drain regions, and a gate separated from the channel region by a gate oxide. The MOSFET is a programmed MOSFET having a positive charge trapped in the gate oxide such that a threshold voltage of the MOSFET is significantly altered compared to a threshold voltage of the MOSFET in an unprogrammed state.

Another method embodiment for performing address decoding in a memory includes writing to a MOSFET associated with a row of the address decoder, thereby causing a positive charge to be trapped in a gate oxide of the MOSFET associated with the row. Writing to the MOSFET associated with the row causes the row to be uncoupled from a row driver. A MOSFET associated with a redundant row of the address decoder is erased by removing a positive charge trapped in a gate oxide of the MOSFET associated with the redundant row. Erasing the MOSFET associated with the redundant row causes the redundant row to be coupled to a redundant row driver.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

These and other aspects and advantages of the present invention will become apparent upon reading the following detailed description and upon reference to the drawings, in which.

Figure 1A:
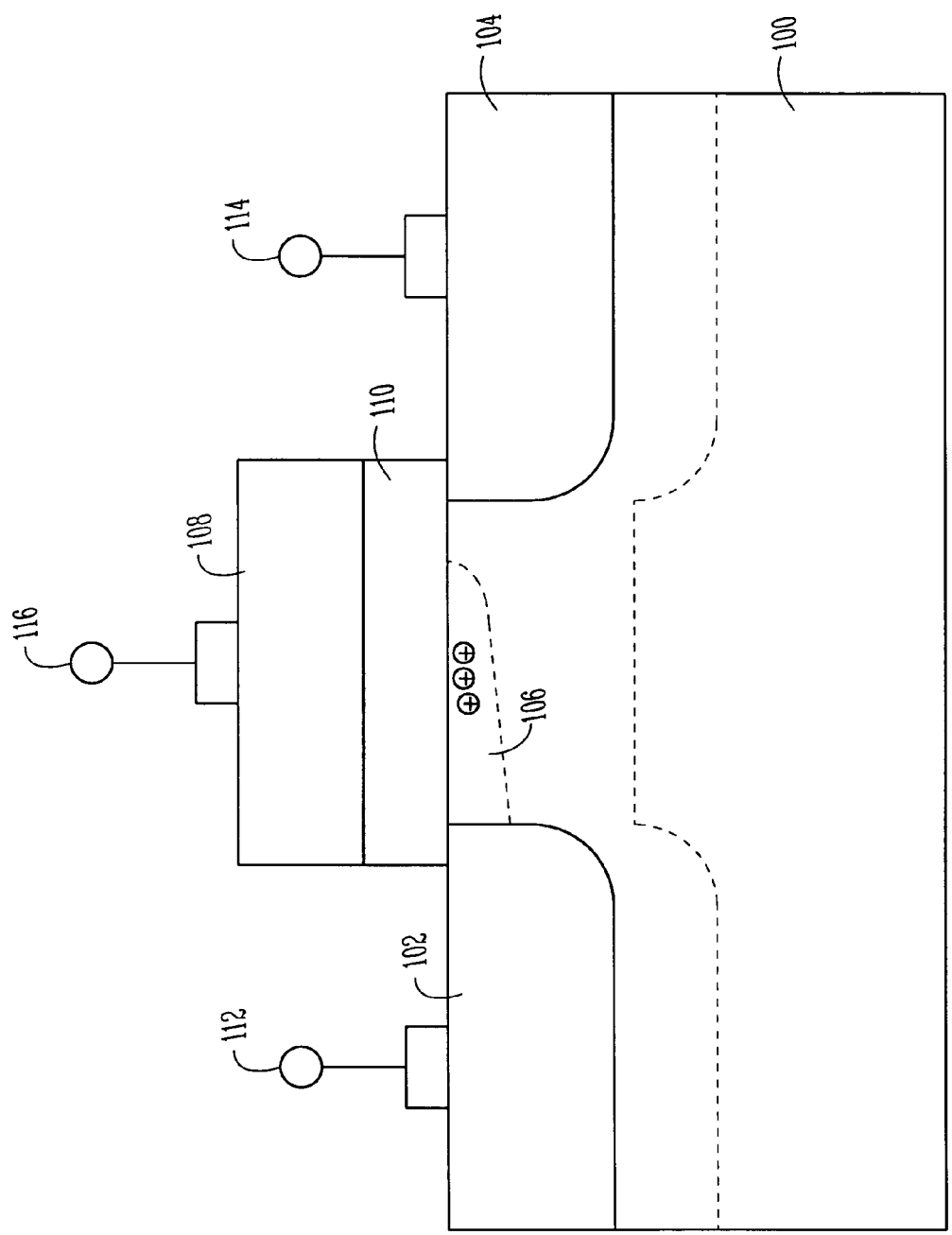
FIG. 1A is a block diagram of a conventional metal oxide semiconductor field effect transistor (MOSFET).

The invention is amenable to various modifications and alternative forms. Specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

In the following detailed description of the invention, reference is made to the accompanying drawings, which form a part hereof, and in which is shown, by way of illustration, specific embodiments in which the invention may be practiced. In like drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereon. Both wafer and substrate include doped and undoped semiconductors, epitaxial semiconductors supported by a base semiconductor or insulator, as well as other semiconductor structures well known to one skilled in the art. The term conductor is understood to include semiconductors, and the term insulator is defined to include any material that is less electrically conductive than the materials generally referred to as conductors by those skilled in the art.

The term "horizontal" as used in this application is defined as a plane substantially parallel to the conventional plane or surface of a wafer or substrate, regardless of the orientation of the wafer or substrate. The term "vertical" refers to a direction substantially perpendicular to the horizontal as defined above. Prepositions, such as "on," "upper," "side" (as in "sidewall"), "higher," "lower," "over," and "under" are defined with respect to the conventional plane or surface being on the top surface of the wafer or substrate, regardless of the orientation of the wafer or substrate.

P-type conductivity is conductivity associated with holes in a semiconductor material, and n-type conductivity is conductivity associated with electrons in a semiconductor material. Throughout this specification the designation "n+" refers to semiconductor material that is heavily doped n-typed semiconductor material, e.g., monocrystalline silicon or polycrystalline silicon. Similarly, the designation "p+" refers to semiconductor material that is heavily doped p-type semiconductor material. The designations "n−" and "p−" refer to lightly doped—and p-type semiconductor materials, respectively.

In this description, a transistor is described as being activated or switched on when it is rendered conductive by a control gate voltage that is greater than its source voltage by at least its threshold voltage. The transistor is described as being in an inactive state or switched off when the control gate voltage is greater than the source voltage by less than the threshold voltage and the transistor is rendered non-conductive. A digital signal of 1 may also be called a high signal and a digital signal of 0 may also be called a low signal. All embodiments of the present invention described herein may be coupled to receive a supply voltage VCC, which is within approximately 1–5 volts. VCC is generated by a circuit that is not shown for purposes of brevity, but is known to those skilled in the art.

In some types of conventional flash memories, erasure is achieved using a positive source bias voltage and negative control gate voltages. This technique has been employed to allow large erase voltage differences between the control gate and source while avoiding hot hole injection from the substrate into the tunnel oxide. Hot (i.e., high energy) hole injection can result in trapped holes in the tunnel oxide and, consequently, erratic over-erasure and anomalous charge loss rates.

Certain conventional flash memories, e.g., some types that are based on p-channel MOSFETs, use hot hole injection as a memory technique. In such memories, holes in the silicon substrate are generated by light or by injection from bipolar transistor-like structures. FIG. 1A depicts a conventional metal oxide semiconductor field effect transistor (MOSFET) in a substrate 100. The MOSFET includes a source region 102, a drain region 104, and a channel region 106 in the substrate 100 between the source region 102 and the drain region 104. A gate 108 is separated from the channel region 106 by a gate oxide 110. A source line 112 is coupled to the source region 102. A bitline 114 is coupled to the drain region 104. A wordline 116 is coupled to the gate 108.

Holes are generated within the device by a photoelectric effect. In conventional operation, a drain to source voltage potential ($V_{ds}$) is set up between the drain region 104 and the source region 102. A negative voltage potential is then applied to the gate 108 via the wordline 116. Once the negative voltage potential applied to the gate exceeds the characteristic voltage threshold ($V_t$) of the MOSFET, the channel 106 forms in the substrate 100 between the drain region 104 and the source region 102. Formation of the channel 106 permits conduction between the drain region 104 and the source region 102, and a current $I_{ds}$ can be detected at the drain region 104.

Figure 1B:
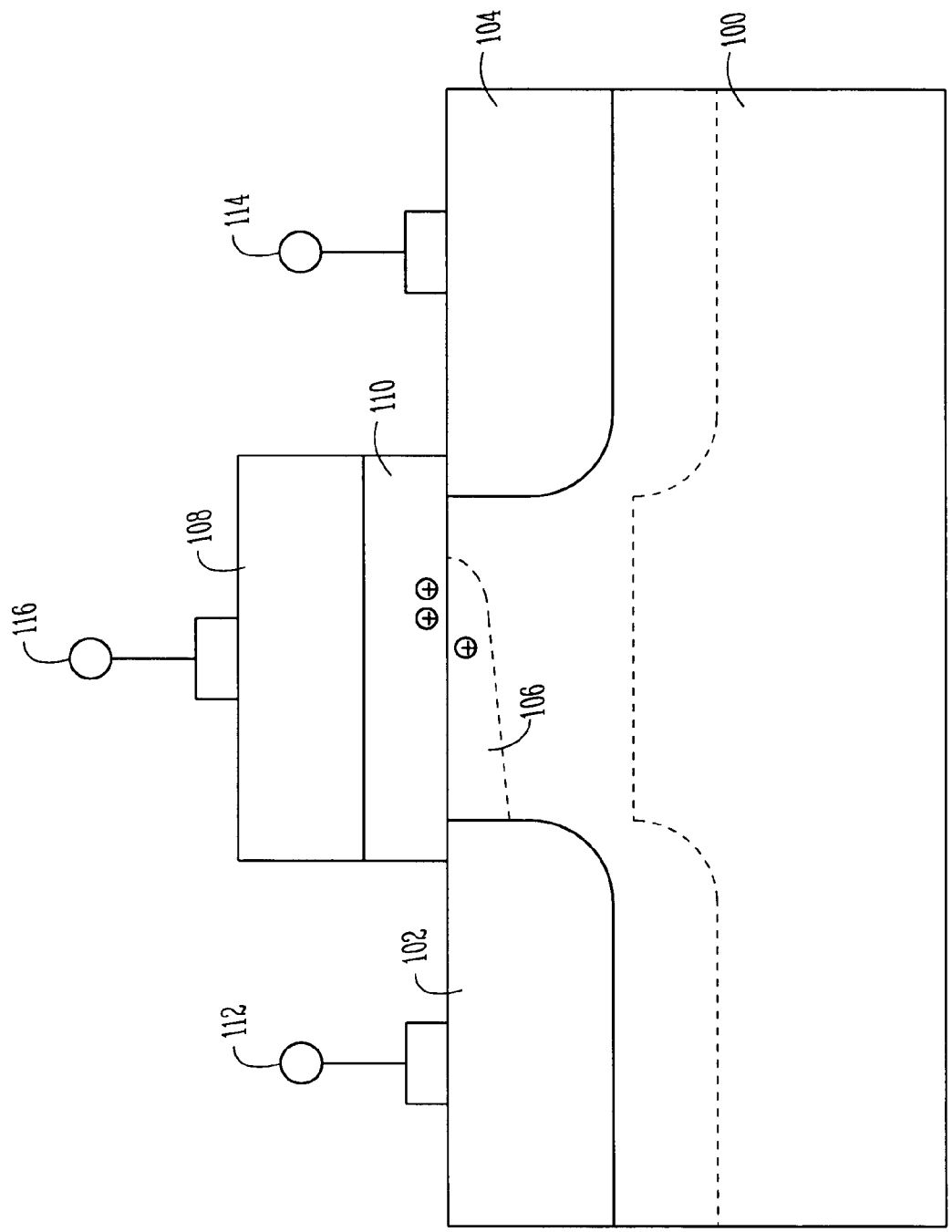
FIG. 1B illustrates the MOSFET of FIG. 1A operated in a forward direction showing some device degradation due to holes being trapped near the drain region with continued use.

The negative voltage potential applied to the gate causes holes to be injected into the gate oxide 110. During normal operation of the conventional MOSFET of FIG. 1A, some device degradation gradually occurs for MOSFETs operated in the forward direction due to holes being trapped in the gate oxide 110 near the drain region 104. This effect is depicted in FIG. 1B. Since the holes are trapped near the drain region 104, however, they are not very effective in changing the characteristics of the MOSFET.

Figure 2A:
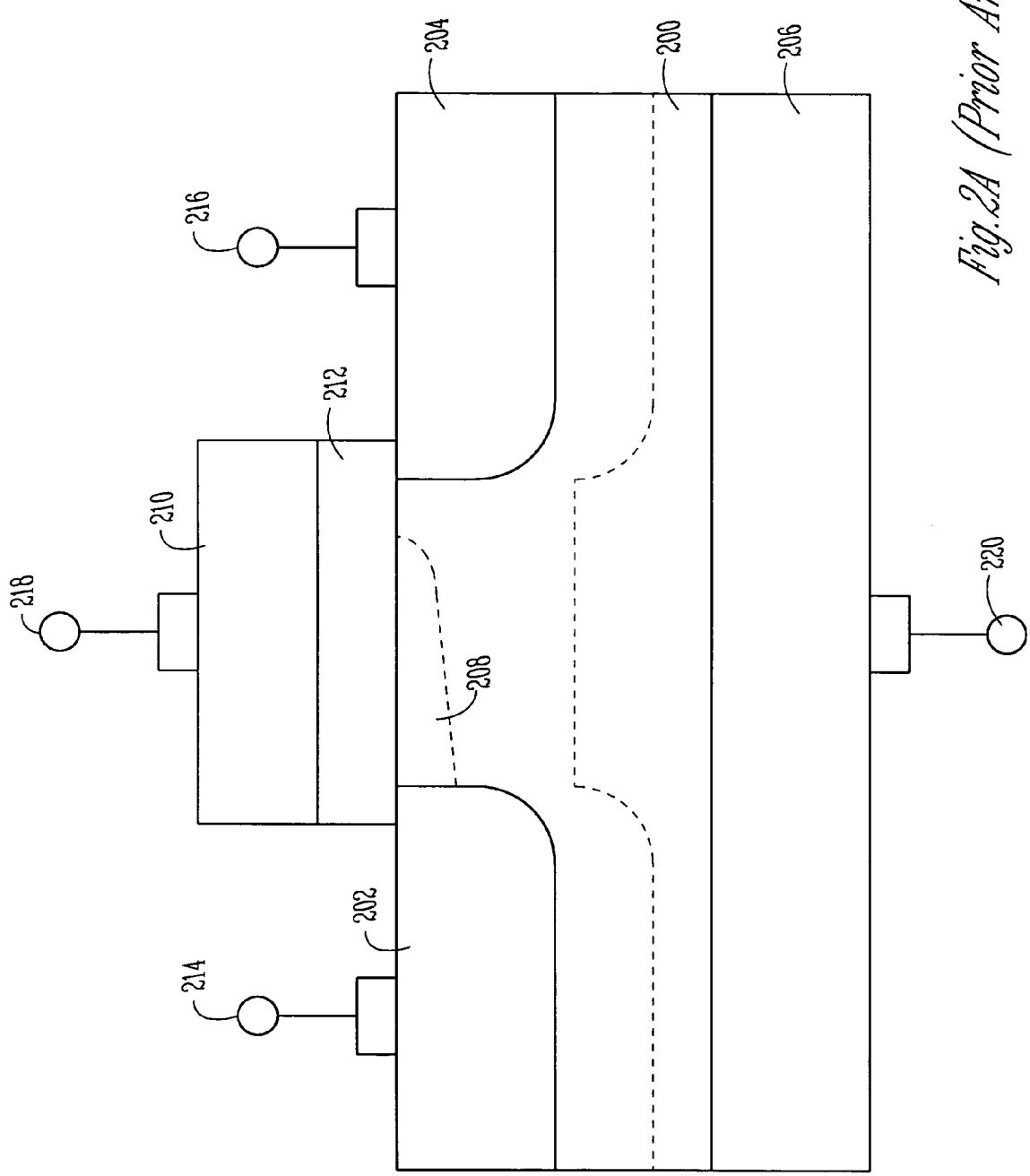
FIG. 2A is a block diagram of a conventional semiconductor device having a bipolar transistor-like structure.

FIG. 2A depicts a conventional semiconductor device having a bipolar (pnp) transistor-like structure. The device includes a source region 202, a drain region 204, a back gate region 206, and a channel region 208 in the substrate 200 between the source region 202 and the drain region 204. A gate 210 is separated from the channel region 208 by a gate oxide 212. A source line 214 is coupled to the source region 202 and to ground. A bitline 216 is coupled to the drain region 204. A wordline 218 is coupled to the gate 210. A terminal 220 is coupled to the back gate region 206.

Figure 2B:
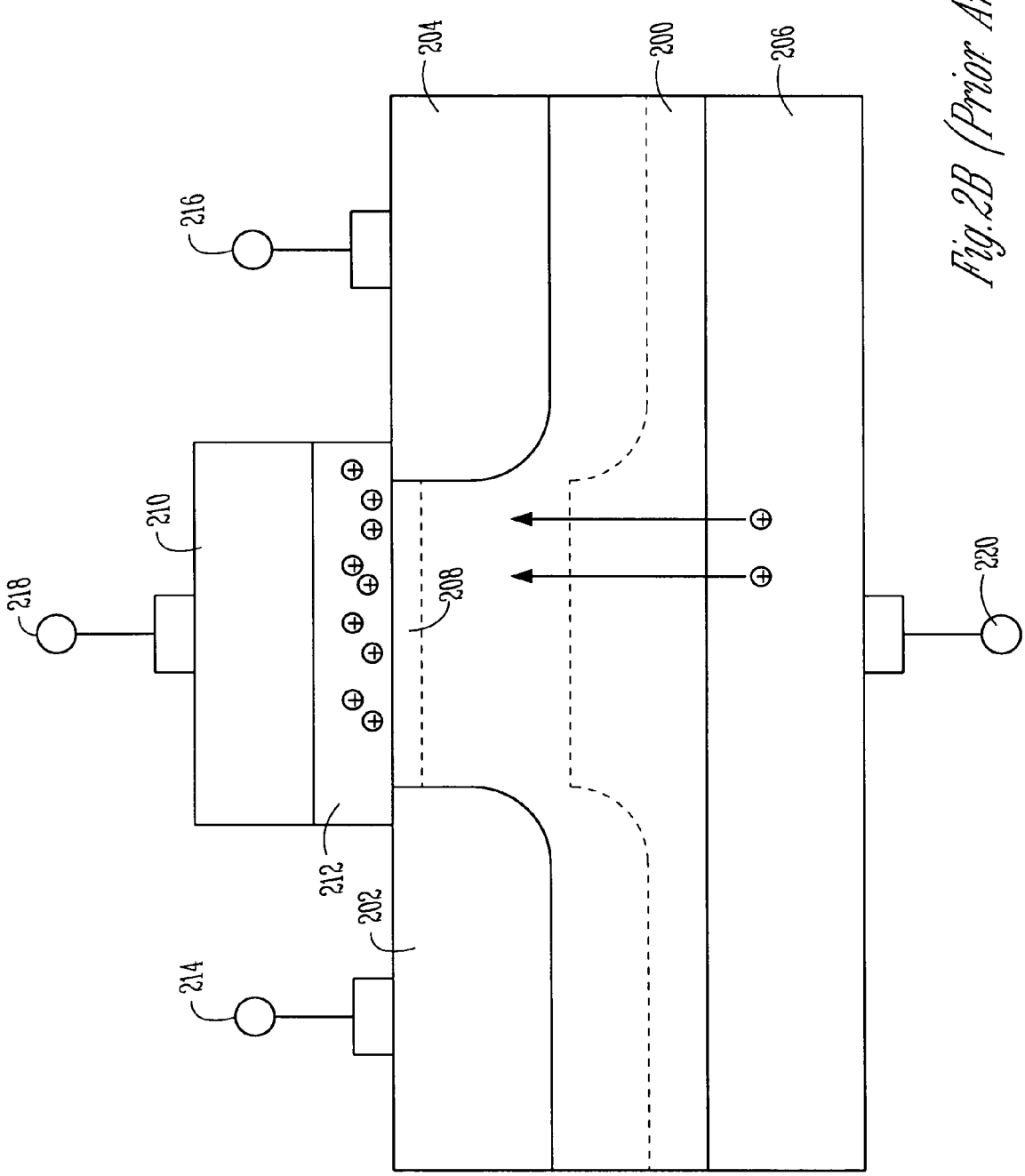
FIG. 2B illustrates the device of FIG. 2A operated in a forward direction showing some device degradation due to holes being trapped near the drain region with continued use.

When a positive voltage $V_{eb}$ is applied to the back gate region 206 via the terminal 220 and a negative voltage is applied to the gate 210 via the wordline 218, holes are injected from the pn junction in the back gate region to the gate oxide 212. This effect is depicted in FIG. 2B and results in a change in the device threshold voltage.

It is also well-known in the art that the positive charge generated in gate oxides by hot hole injection can be erased by avalanche electron injection. In avalanche multiplication and electron injection, the electrons just jump over the barrier at the silicon surface, i.e., 3.2 eV, and become less energetic and are trapped once they reach the oxide. Some of these electrons can be trapped at the positive charge centers, thereby eradicating them. This phenomenon has been used as the basis for a memory device based on hot hole injection, with erasure being achieved by hot electron injection.

Hot hole injection, however, is but one mechanism that can result in positive charge generation and trapping in tunnel oxides. According to the teachings of the present invention, p-channel MOSFET devices are used as reprogrammable fuse or antifuse elements in a memory decode circuit by utilizing anomalous hole generation. Specifically, a sufficiently large negative gate bias voltage is applied to cause tunnel electrons to gain enough energy to exceed the band gap energy of the oxide. As a result, energetic hole-electron pairs are generated in the silicon substrate. The holes are then injected from the substrate into the oxide, where they remain trapped. A large shift in the threshold voltage of the p-channel MOSFET results. The device can subsequently be reset by applying a positive gate bias voltage. Accordingly, particular benefits are realized for applications in which reprogrammability is desired or required. Further, such fuse or antifuse elements can be implemented readily in the context of a MOSFET memory process flow.

Figure 3:
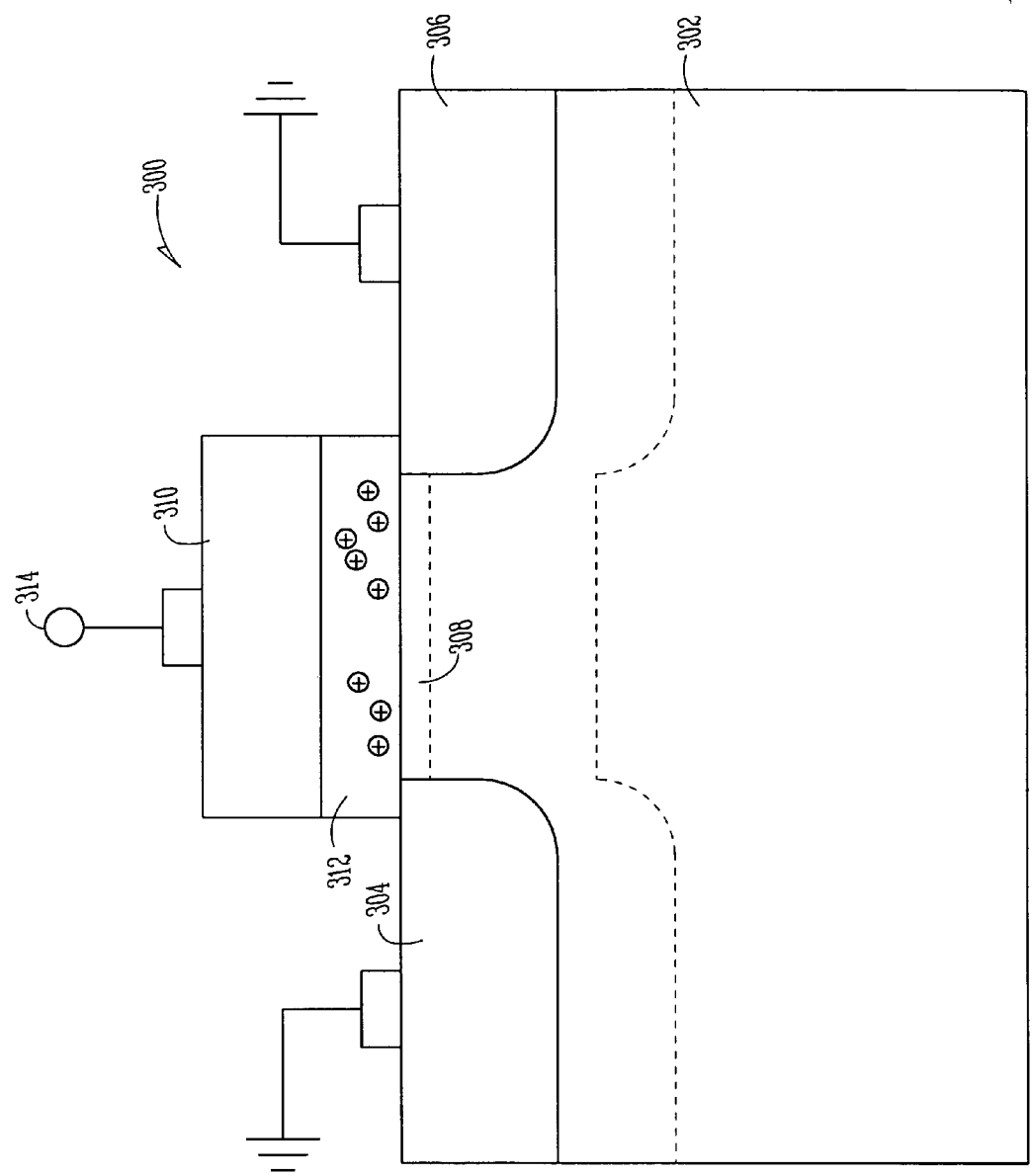
FIG. 3 is a diagram of a programmable MOSFET device that can be used as a circuit switch, or a nonvolatile, reprogrammable switch, according to one embodiment of the present invention.

Referring again to the drawings, FIG. 3 depicts a p-channel MOSFET device 300. The MOSFET device 300 is formed on a substrate 302 and includes a first source/drain region 304, a second source/drain region 306, and a channel region 308 in the substrate 302 between the source/drain regions 304 and 306. A gate region 310 is separated from the substrate 302 by a gate oxide 312. In one embodiment, the first source/drain region 304 includes a source region for the MOSFET, and the second source/drain region 306 includes a drain region for the MOSFET.

In the device 300 of FIG. 3, both the source/drain regions 304 and 306 are coupled to ground. A large negative gate bias voltage is applied to the gate region 310 via a wordline 314. This bias voltage generates holes and causes them to jump to the gate oxide 312. $V_{OX}$ denotes the voltage difference across the tunnel oxide. If $V_{OX}$ exceeds a critical value, e.g., 8 V, during Fowler-Nordhiem tunneling, the tunnel electrons can gain enough energy to exceed the band gap energy of the oxide, which is approximately 8–9 eV. Potential drops are large, and the electrons only have to tunnel a short distance. Once the electrons are in the oxide, they are accelerated by the high electric fields and potential drops. They can then gain the 8 eV required to generate energetic hole-electron pairs at the surface of the silicon substrate 302. The holes are then injected into the oxide.

Figure 4:
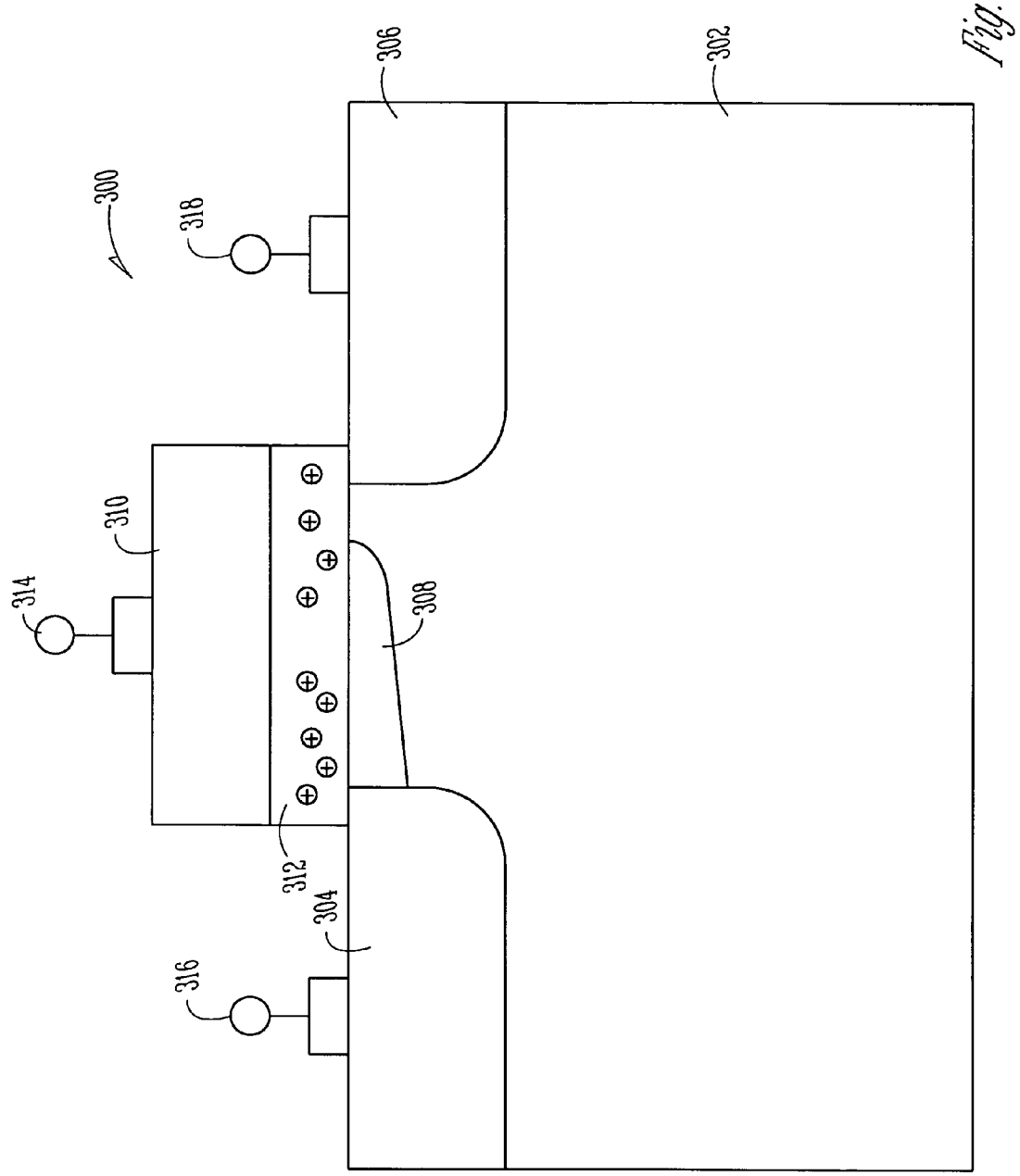
FIG. 4 depicts the device of FIG. 3 after application of a large negative gate bias voltage.
Figure 5:
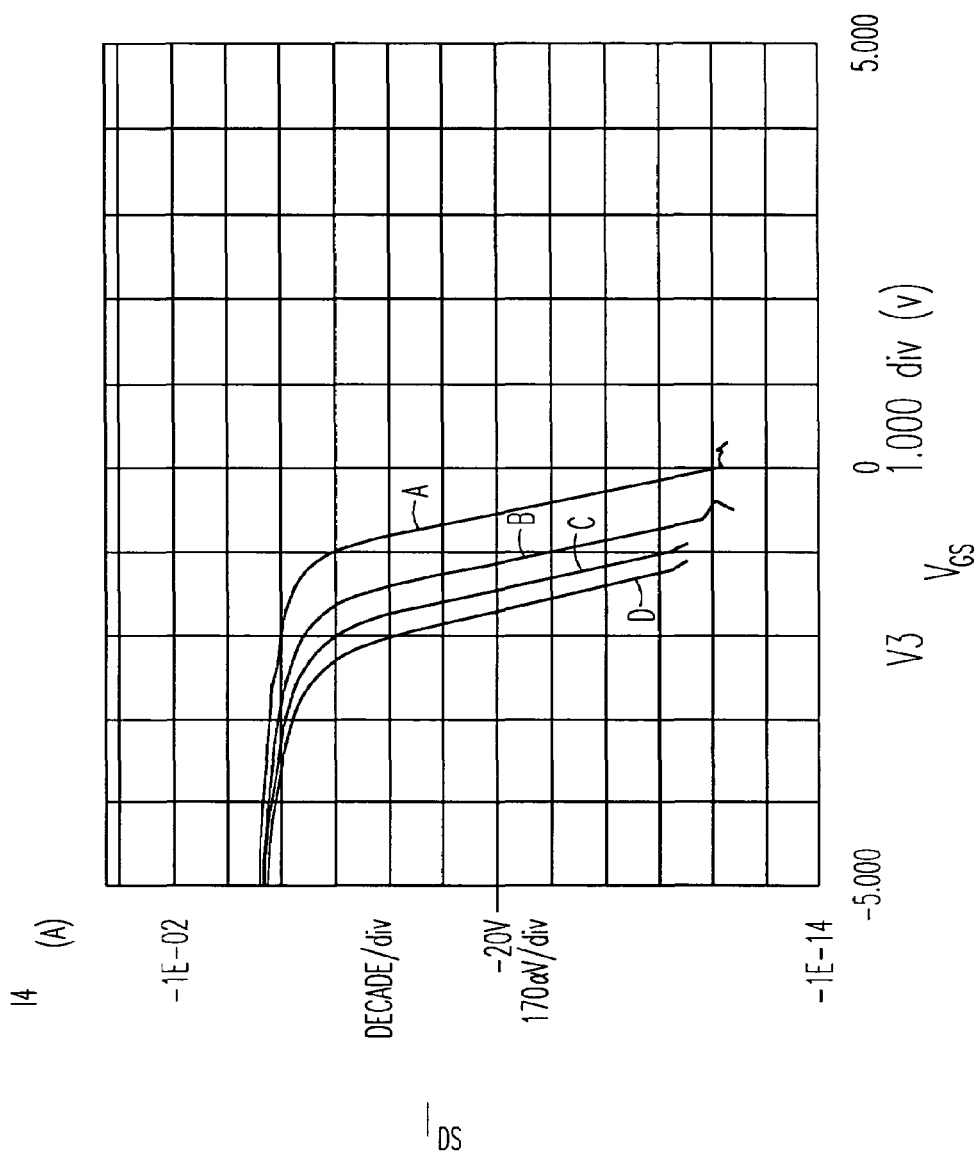
FIG. 5 depicts a shift in the threshold voltage of a p-channel MOSFET device resulting from trapped positive charge in the oxide, according to an embodiment of the present invention.

When the substrate 302 is inverted, an electric field is present in the silicon substrate 302, and the holes can then be injected from the substrate 302 into the gate oxide 312. The holes remain trapped in the oxide 312 in the p-channel MOSFET device 300, as depicted in FIG. 4. As a result, a net positive trapped charge is generated. This positive trapped oxide charge results in a large shift in the threshold voltage $V_T$ of the p-channel MOSFET device 300, as shown in FIG. 5. The device 300 can be reset by applying a positive gate bias.

FIG. 5 is a graph depicting a current signal $I_{ds}$ detected at the second source/drain region 304 of FIG. 3 plotted against a gate voltage $V_{gs}$ with a drain voltage applied between the first and second source/drain regions 304 and 306. In one embodiment, $V_{gs}$ represents the voltage potential applied to the gate region 310. In FIG. 5, the curve plotted as A depicts the conduction behavior of an unprogrammed p-channel MOSFET. The curves plotted as B, C, and D depict the conduction behavior of the same p-channel MOSFET at various points in time after application of a large negative gate bias voltage.

Figure 6:
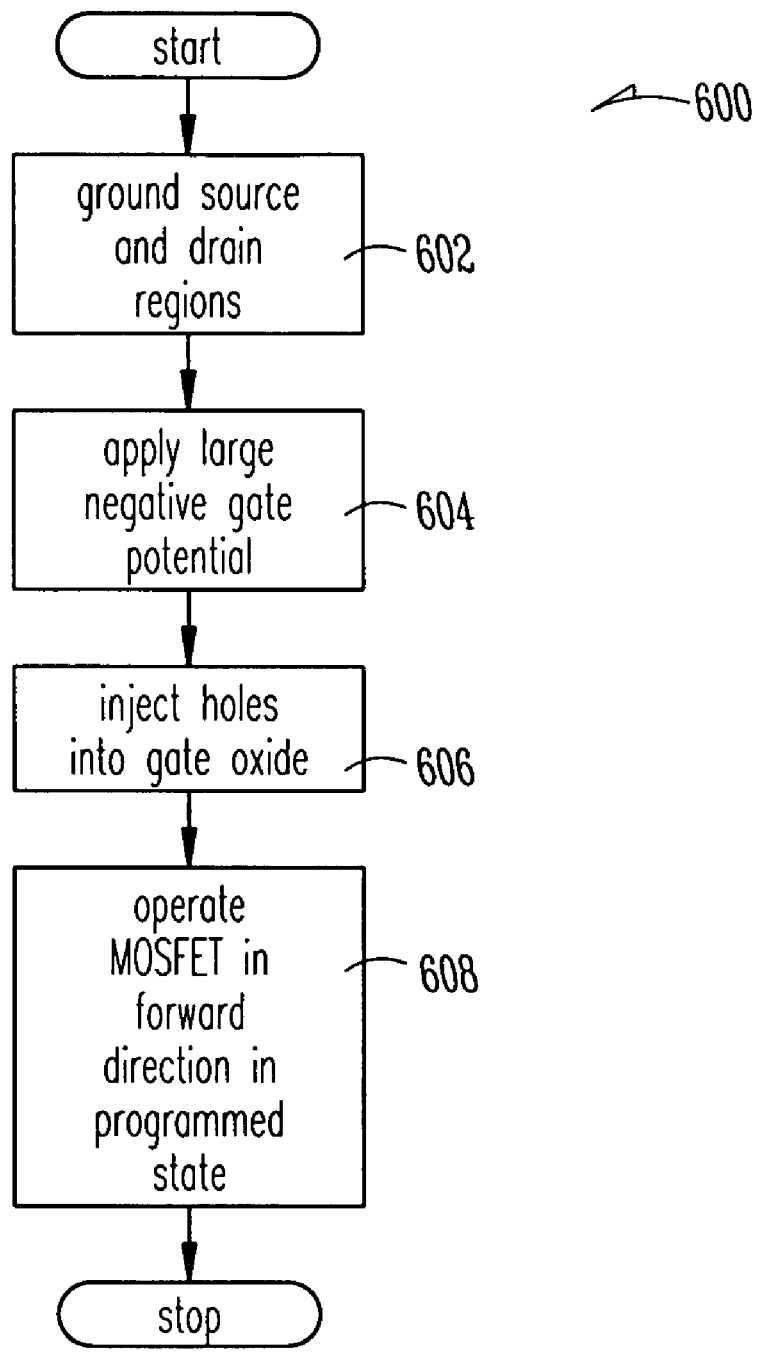
FIG. 6 is a flowchart depicting a method of programming the device of FIG. 3, according to another embodiment of the present invention.

The p-channel MOSFET device 300 thus has a programmable and variable threshold voltage. FIG. 6 is a flowchart suitable for explaining a method 600 by which the MOSFET device can be programmed to achieve embodiments of the present invention. To program the p-channel MOSFET device 300, the source/drain regions 304 and 306 are both grounded, as illustrated at a block 602. Next, at a block 604, a large negative gate potential $V_{gs}$ is applied to the gate region 310 via the wordline 314. As shown in FIG. 6, applying the gate potential $V_{gs}$ causes energetic hole-electron pairs to be generated in the substrate 302. At a block 606, the holes are then injected from the substrate 302 into the gate oxide 312, where they remain trapped.

In one embodiment of the present invention, the method is continued at a block 608 by subsequently operating the p-channel MOSFET device 300 in a forward direction in its programmed state. Accordingly, the method includes coupling a sourceline 318 to the source/drain region 306. A bitline 316 is coupled to the source/drain region 304. A gate potential is then applied to the gate region 310 via the wordline 314, such that a conduction channel 308 is formed between the source/drain regions 304 and 306.

Figure 7:
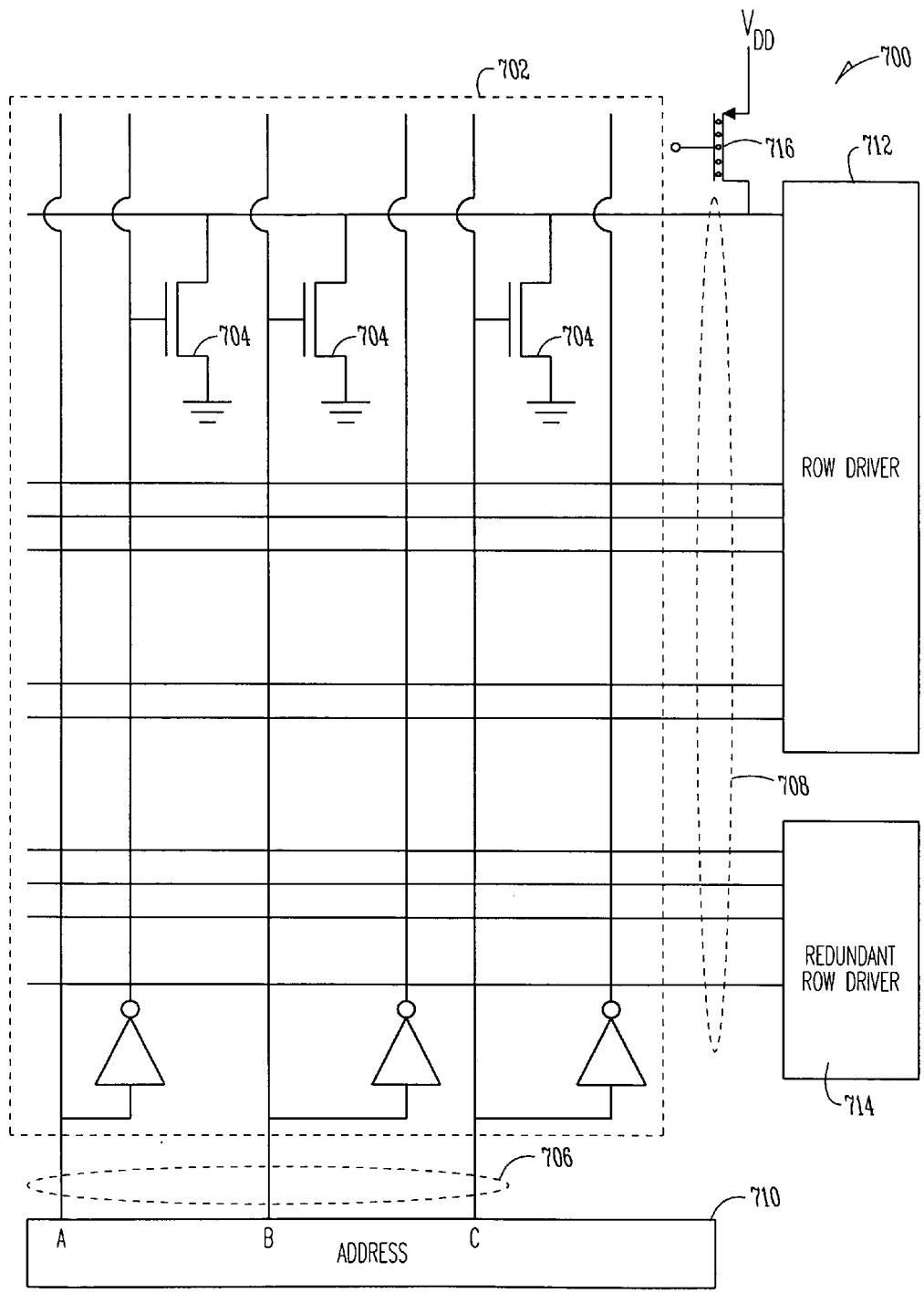
FIG. 7 depicts an example integrated circuit incorporating a programmable fuse, according to another embodiment of the present invention.
Figure 8:
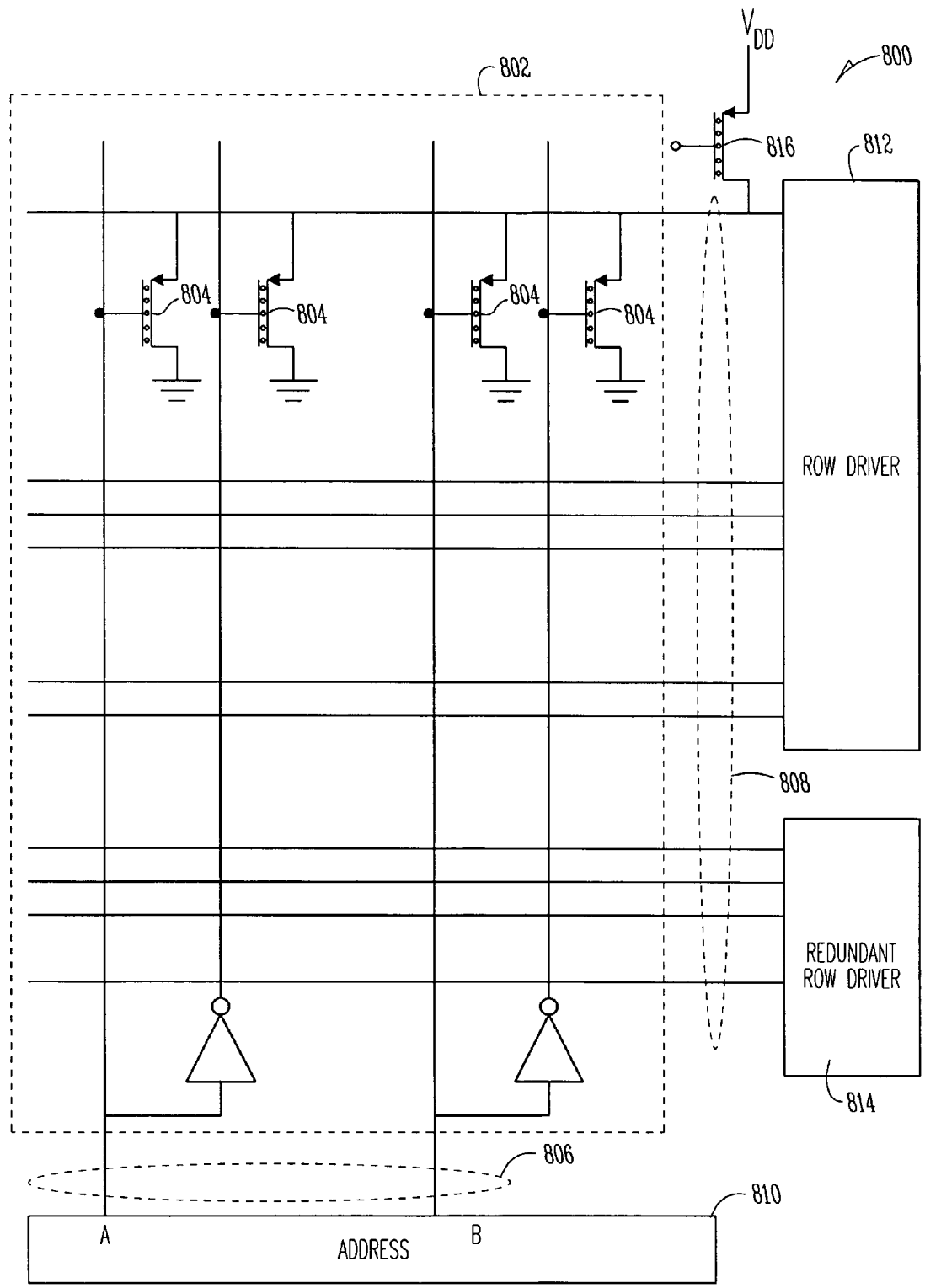
FIG. 8 depicts an example integrated circuit incorporating a programmable antifuse, according to still another embodiment of the present invention.

According to embodiments of the present invention, the device 300 is used to implement fuse and/or antifuse elements in memory address decode circuits for removing rows with faulty devices and substituting instead redundant rows in the array, as depicted in FIGS. 7 and 8. Advantageously, a separate latch circuit arrangement is not needed in the embodiments of FIGS. 7 and 8. Further, the arrangement depicted in FIG. 8 can be implemented using only p-channel MOSFET devices of the type illustrated and described above in connection with FIG. 3 and can thus be fabricated in a single well.

FIG. 7 illustrates an example integrated circuit 700 that incorporates a programmable fuse, according to an embodiment of the present invention. In one embodiment, the integrated circuit 700 includes an address decoder portion for a memory. As shown in FIG. 7, the integrated circuit 700 includes a programmable decoder 702. According to this embodiment, the decoder 702 includes an array of NMOS transistors 704 arranged in a matrix of rows and columns.

According to this embodiment of the present invention, the array of NMOS transistors 704 are disposed at the intersection of a number of first transmission lines, shown collectively at reference numeral 706, and a number of second transmission lines, shown collectively at reference numeral 708. The first transmission lines 706 couple an address driver 710 to the array of NMOS transistors 704 in the programmable decoder 702. In one embodiment, the first transmission lines 706 include a number of address input lines. The second transmission lines 708 couple at least one row driver 712 and at least one redundant row driver 714 to the array of NMOS transistors 704 in the programmable decoder 702. While FIG. 7 depicts only one row driver 712 and one redundant row driver 714, it will be appreciated by those skilled in the art that the integrated circuit 700 may include any number of row drivers 712 and redundant row drivers 714. In one embodiment, the second transmission lines 708 include a number of output lines.

According to a particular embodiment of the present invention, a programmable fuse 716 is used to remove rows with faulty devices, e.g., faulty NMOS transistors 704. In particular, if a row is found to have faulty devices, it is removed by applying a large negative gate potential to the gate of the programmable fuse 716, thereby programming it. Redundant rows are substituted in place of the removed rows.

In a method embodiment of the present invention, address decoding is performed in a memory by coupling first transmission lines 706, e.g., address lines, to a number of NMOS transistors 704 in the programmable decoder 702. Second transmission lines 708, e.g., output lines, are also coupled to the NMOS transistors 704. At least one programmable fuse 716 is used to replace a faulty row with a redundant row by programming the fuse 716 as described above in connection with FIG. 6. Specifically, a fuse 716 associated with the faulty row is placed in a programmed state, and a fuse 716 associated with a corresponding redundant row is placed in an unprogrammed state. The fuse 716 associated with the redundant row is placed in the unprogrammed state by removing the charge trapped in the gate oxide region adjacent to the source region of the fuse 716.

FIG. 8 depicts an example integrated circuit 800 that incorporates a programmable antifuse, according to another embodiment of the present invention. In one embodiment, the integrated circuit 800 includes an address decoder portion for a memory. As shown in FIG. 8, the integrated circuit 800 includes a programmable decoder 802. According to this embodiment, the decoder 802 includes an array of programmable antifuses 804 arranged in a matrix of rows and columns. The antifuses are implemented using MOSFET devices as depicted in FIG. 3.

According to this embodiment of the present invention, the array of programmable antifuses 804 are disposed at the intersection of a number of first transmission lines, shown collectively at reference numeral 806, and a number of second transmission lines, shown collectively at reference numeral 808. The first transmission lines 806 couple an address driver 810 to the array of programmable antifuses 804 in the programmable decoder 802. In one embodiment, the first transmission lines 806 include a number of address input lines. The second transmission lines 808 couple at least one row driver 812 and at least one redundant row driver 814 to the array of antifuses 804 in the programmable decoder 802. While FIG. 8 depicts only one row driver 812 and one redundant row driver 814, it will be appreciated by those skilled in the art that the integrated circuit 800 may include any number of row drivers 812 and redundant row drivers 814. In one embodiment, the second transmission lines 808 include a number of output lines.

According to a particular embodiment of the present invention, a switch 816 is used to remove rows with faulty devices. In particular, if a row is found to have faulty devices, it is removed upon closing the switch 816 and causing the gate-source voltage $V_{GS}$ for each antifuse 804 to increase in magnitude. If the antifuse is not programmed, the gate-source voltage $V_{GS}$ will exceed the threshold voltage $V_T$, and the device will conduct, removing the row. If the antifuse has been programmed with a positive charge trapped in the gate, it will not conduct, and the row can be selected. In this way, the antifuses 804 are used to select redundant rows to replace faulty rows. As mentioned above, the arrangement shown in FIG. 8 can be implemented using only p-channel MOSFET devices of the type illustrated and described above in connection with FIG. 3. Thus, the integrated circuit 800 can be fabricated in a single well.

Figure 9:
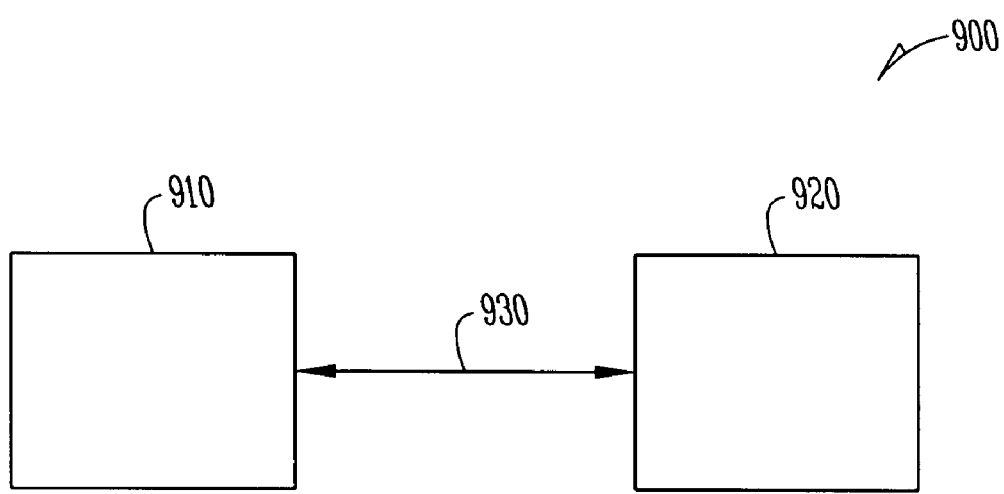
FIG. 9 is a block diagram illustrating an example electronic system according to another embodiment of the present invention.

FIG. 9 is a block diagram illustrating an example electronic system 900 according to another embodiment of the present invention. As shown in FIG. 9, the electronic system includes a memory 910 and a processor 920 coupled to the memory 910 by a system bus 930. In one embodiment, the processor and memory are located on a single semiconductor chip. The memory 910 includes a programmable decoder that has at least one programmable fuse or antifuse as explained and described in detail in connection with FIGS. 7 and 8.

CONCLUSION

Accordingly, techniques for using MOSFET devices as programmable fuse and antifuse elements has been shown by the present invention. Advantages of the present invention include reprogrammability of the fuse and antifuse elements, as well as compatibility with existing MOSFET memory technology. Moreover, the fuse and antifuse elements of the present invention can be fabricated on a flash memory chip with little or no modification of the memory process flow.

The various embodiments described above are provided by way of illustration only and should not be construed to limit the invention. Those skilled in the art will readily recognize various modifications and changes that can be made to these embodiments without strictly following the example embodiments and applications illustrated and described herein, and without departing from the true spirit and scope of the present invention, which is set forth in the following claims.

What is claimed is:

1. A method for programming a p-channel MOSFET in a substrate into a reprogrammable switch, the method comprising:
    applying a first voltage potential to a source region of the MOSFET;
    applying a second voltage potential to a drain region of the MOSFET; and
    applying a sufficiently large negative gate potential to a gate region of the MOSFET to cause tunnel electrons to exceed a gate oxide band gap and generate electron hole pairs in a channel region between the source region and the drain region;
    wherein applying the first and second voltage potentials and the sufficiently large negative gate potential causes an anomalous hole injection from the substrate into the gate oxide of the MOSFET.

2. The method of claim 1, wherein applying the first voltage potential to the source region of the MOSFET comprises grounding the source region of the MOSFET.

3. The method of claim 1, wherein applying the second voltage potential to the drain region of the MOSFET comprises grounding the drain region of the MOSFET.

4. The method of claim 1, wherein applying the sufficiently large negative gate potential causes Fowler-Nordheim tunneling, and also forms a conduction channel between the source and drain regions of the MOSFET.

5. The method of claim 1, further comprising operating the MOSFET in a forward direction in a programmed state by:
    coupling a sourceline to the source region;
    coupling a bitline to the drain region; and
    applying a gate potential to the gate region such that a conduction channel is formed between the source region and the drain region.

6. A method for programming a p-channel MOSFET in a substrate into a reprogrammable switch, the method comprising:
    coupling a source region of the MOSFET and a drain region of the MOSFET to an electrical ground; and
    applying a negative gate potential to a gate region of the MOSFET,
    wherein applying the negative gate potential to the gate region causes an anomalous hole injection from a MOSFET substrate into the gate oxide of the MOSFET in response to tunnel electrons exceeding a gate oxide band gap and forming electron hole pairs in the substrate.

7. A method for performing address decoding in a memory, the method comprising:
    coupling a plurality of address lines and a plurality of output lines to a programmable decoder having a plurality of rows and a plurality of redundant rows; and
    unselecting a row by using electron tunneling to form electron hole pairs in a memory substrate and anomalous hole injection to program a programmable switch associated with the row, the programmable switch comprising a metal oxide semiconductor field effect transistor (MOSFET) in the substrate, the MOSFET having a first source/drain region, a second source/drain region, a channel region between the first and second source/drain regions, and a gate separated from the channel region by a gate oxide,
    wherein the MOSFET is a programmed MOSFET having a positive charge trapped in the gate oxide such that a threshold voltage of the MOSFET is significantly altered compared to a threshold voltage of the MOSFET in an unprogrammed state.

8. The method of claim 7, further comprising selecting a redundant row by reprogramming a programmable switch associated with the redundant row, the programmable switch comprising a metal oxide semiconductor field effect transistor (MOSFET) in a substrate, the MOSFET having a first source/drain region, a second source/drain region, a channel region between the first and second source/drain regions, and a gate separated from the channel region by a gate oxide, wherein the programmable switch associated with the redundant row is reprogrammed by removing a trapped positive charge from the gate oxide.

9. The method of claim 7, wherein using electron tunneling and anomalous hole injection to trap the positive charge in the gate oxide comprises:

applying a first voltage potential to a source region of the MOSFET;

applying a second voltage potential to a drain region of the MOSFET; and applying a negative gate potential to a gate region of the MOSFET, wherein applying the first and second voltage potentials and the negative gate potential causes anomalous hole injection from the substrate into the gate oxide of the MOSFET.

10. The method of claim 9, wherein applying the first voltage potential to the source region of the MOSFET comprises grounding the source region of the MOSFET.

11. The method of claim 9, wherein applying the second voltage potential to the drain region of the MOSFET comprises grounding the drain region of the MOSFET.

12. The method of claim 9, wherein applying the negative gate potential to the gate region of the MOSFET comprises applying a sufficiently large negative gate potential to form a conduction channel between the source and drain regions of the MOSFET.

13. The method of claim 9, further comprising operating the MOSFET in a forward direction in a programmed state by:

coupling a sourceline to the source region;

coupling a bitline to the drain region; and applying a gate potential to the gate region such that a conduction channel is formed between the source region and the drain region.

14. A method for programming an address decoder in a memory, the method comprising:

writing to a metal oxide semiconductor field effect transistor (MOSFET) associated with a row of the address decoder, thereby causing a positive charge to be trapped by anomalous hole injection in a gate oxide of the MOSFET associated with the row, wherein writing to the MOSFET associated with the row causes the row to be uncoupled from a row driver; and erasing a MOSFET associated with a redundant row of the address decoder, thereby removing a positive charge trapped in a gate oxide of the MOSFET associated with the redundant row, wherein erasing the MOSFET associated with the redundant row causes the redundant row to be coupled to a redundant row driver.

15. The method of claim 14, wherein writing to the MOSFET associated with the row of the address decoder comprises using Fowler-Nordheim electron tunneling and anomalous hole injection to trap the positive charge in the gate oxide of the MOSFET associated with the row of the address decoder.

16. The method of claim 15, wherein using the anomalous hole injection to trap the positive charge in the gate oxide of the MOSFET associated with the row of the address decoder comprises:

applying a first voltage potential to a source region of the MOSFET;

applying a second voltage potential to a drain region of the MOSFET; and applying a sufficiently large negative gate potential to a gate region of the MOSFET, wherein applying the first and second voltage potentials and the sufficiently large negative gate potential causes electrons to tunnel through the gate oxide and to form electron hole pairs in a memory substrate and anomalous hole injection from the substrate into the gate oxide of the MOSFET.

17. The method of claim 16, wherein applying the first voltage potential to the source region of the MOSFET comprises grounding the source region of the MOSFET.

18. The method of claim 16, wherein applying the second voltage potential to the drain region of the MOSFET comprises grounding the drain region of the MOSFET.

19. The method of claim 16, wherein applying the sufficiently large negative gate potential to the gate region of the MOSFET forms a conduction channel between the source and drain regions of the MOSFET.

20. The method of claim 16, further comprising operating the MOSFET in a forward direction in a programmed state by:

coupling a sourceline to the source region;

coupling a bitline to the drain region; and applying a gate potential to the gate region such that a conduction channel is formed between the source region and the drain region.

21. The method of claim 14, wherein erasing the MOSFET associated with a redundant row of the address decoder comprises using avalanche electron injection to remove the trapped positive charge from the gate oxide of the MOSFET associated with the redundant row of the address decoder.

22. The method of claim 16, wherein the MOSFET is a programmed MOSFET having a positive charge trapped in the gate oxide such that a threshold voltage of the MOSFET is significantly altered compared to a threshold voltage of the MOSFET in an unprogrammed state, wherein the amount of the alteration of the threshold voltage as compared to an unprogrammed threshold is a variable value depending upon a time and voltage level of the applying a sufficiently large negative gate potential to a gate region of the MOSFET.

23. An electronic system having at least one programmable switch element, comprising:

means for applying a first voltage potential to a source region of a MOSFET comprising at least a portion of the at least one programmable switch element;

means for applying a second voltage potential to a drain region of the MOSFET; and means for applying a sufficiently large negative gate potential to a gate region of the MOSFET to cause tunnel electrons to exceed a gate oxide band gap and generate electron hole pairs in a channel region between the source region and the drain region;

wherein the means for applying the first and second voltage potentials and the sufficiently large negative gate potential causes an anomalous hole injection from the substrate into the gate oxide of the MOSFET.

24. The electronic system of claim 23, wherein the means for applying the first voltage potential to the source region of the MOSFET comprises means for grounding the source region of the MOSFET.

25. The electronic system of claim 23, wherein the means for applying the second voltage potential to the drain region of the MOSFET comprises means for grounding the drain region of the MOSFET.

26. The electronic system of claim 23, wherein the means for applying the sufficiently large negative gate potential causes Fowler-Nordheim tunneling, and also forms a conduction channel between the source and drain regions of the MOSFET.

27. The electronic system of claim 23, wherein the anomalous hole injection from the substrate into the gate oxide of the MOSFET results in a substantially uniform distribution of holes from the source region to the drain region.

28. An integrated circuit having at least one programmable switch element, comprising:
- means for applying a first voltage potential to a source region of a MOSFET forming at least a portion of the at least one programmable switch element;
- means for applying a second voltage potential to a drain region of the MOSFET; and
- means for applying a sufficiently large negative gate potential to a gate region of the MOSFET to cause tunnel electrons to exceed a gate oxide band gap and generate electron hole pairs in a channel region between the source region and the drain region;
- wherein the means for applying the first and second voltage potentials and the sufficiently large negative gate potential causes an anomalous hole injection from the substrate into the gate oxide of the MOSFET.

29. The integrated circuit of claim 28, wherein the means for applying the first voltage potential to the source region of the MOSFET comprises means for grounding the source region of the MOSFET.

30. The integrated circuit of claim 28, wherein the means for applying the second voltage potential to the drain region of the MOSFET comprises means for grounding the drain region of the MOSFET.

31. The integrated circuit of claim 28, wherein the means for applying the sufficiently large negative gate potential causes Fowler-Nordheim tunneling, and also forms a conduction channel between the source and drain regions of the MOSFET.

32. The integrated circuit of claim 28, wherein the anomalous hole injection from the substrate into the gate oxide of the MOSFET results in a substantially uniform distribution of holes from the source region to the drain region.

33. A programmable decoder having an array of programmable switches, comprising:
- means for applying a first voltage potential to a source region of a MOSFET forming at least a portion of each individual one of the array of programmable switches;
- means for applying a second voltage potential to a drain region of the MOSFET; and
- means for applying a sufficiently large negative gate potential to a gate region of the MOSFET to cause tunnel electrons to exceed a gate oxide band gap and generate electron hole pairs in a channel region between the source region and the drain region;
- wherein the means for applying the first and second voltage potentials and the sufficiently large negative gate potential causes an anomalous hole injection from the substrate into the gate oxide of the MOSFET.

34. The programmable decoder of claim 33, wherein the means for applying the first voltage potential to the source region of the MOSFET comprises means for grounding the source region of the MOSFET.

35. The programmable decoder of claim 33, wherein the means for applying the second voltage potential to the drain region of the MOSFET comprises means for grounding the drain region of the MOSFET.

36. The programmable decoder of claim 33, wherein the means for applying the sufficiently large negative gate potential causes Fowler-Nordheim tunneling, and also forms a conduction channel between the source and drain regions of the MOSFET.

37. The programmable decoder of claim 33, wherein the anomalous hole injection from the substrate into the gate oxide of the MOSFET results in a substantially uniform distribution of holes from the source region to the drain region.

\* \* \* \* \*